United States Patent [19]

Jeung et al.

[11] Patent Number: 5,194,136
[45] Date of Patent: Mar. 16, 1993

[54] PROCESS FOR MAKING A DISPLAY PANEL
[75] Inventors: Sehun Jeung; Byungseong Bae, both of Seoul, Rep. of Korea
[73] Assignee: Samsung Electronics Co., Ltd., Suwon, Rep. of Korea
[21] Appl. No.: 899,967
[22] Filed: Jun. 17, 1992
[30] Foreign Application Priority Data
Jun. 17, 1991 [KR] Rep. of Korea ............... 91-10009
[51] Int. Cl.$^5$ ............................................. C25D 5/02
[52] U.S. Cl. ..................................................... 205/122
[58] Field of Search ................................. 205/118, 122
[56] References Cited
U.S. PATENT DOCUMENTS
5,060,036 10/1991 Choi ................................. 357/23.7

OTHER PUBLICATIONS

Japanese Laying Open Gazette No. 2-85826: Specification in Japanese with English translation; title: Display Panel; Appln. No. 2-85826.

Primary Examiner—T. M. Tufariello
Attorney, Agent, or Firm—Robert A. Westerlund; Charles R. Donohoe

[57] ABSTRACT

A method of fabricating a display panel, e.g., of the type used in active matrix liquid crystal display devices, includes the steps of forming a transparent, electrically conductive layer, e.g., an indium tin oxide (ITO) layer on an electrically insulating substrate, e.g., a glass substrate; forming an anodizable metal layer, e.g., an aluminjum (Al) layer, on the ITO layer; performing a first anodization step to thereby form an oxidized insulating layer, e.g., an $Al_2O_3$ layer, on the Al layer; forming a patterned mask on the $Al_2O_3$ layer to provide coverage only over selected regions of the $Al_2O_3$ layer; and, performing a second anodization step to anodize all portions of the Al layer except portions thereof disposed beneath the selected regions, which portions remain intact to serve as the gate electrodes/wiring structures of the display panel. In one embodiment, the ITO layer is patterned before the first anodization step is performed, and in another embodiment, the ITO layer is patterned after the second anodization step is performed. In yet another embodiment, after the Al layer is deposited, a patterned pixel separating layer is formed to provide coverage only over selected portions of the Al layer, i.e., to serve as a mask, so that selected portions of the Al layer are not anodized during the first anodization step, thereby resulting in the formation of a patterned oxide film on the Al layer which is a negative image of the patterned pixel separating layer. Thereafter, a first patterned mask is formed on the patterned oxide film and selected portions of the Al layer to provide coverage over all regions thereof except the desired location of the gate electrode/wiring structures. Then, a second anodization step is carried out to form an $Al_2O_3$ layer on areas uncovered by the first patterned mask. Finally, a second patterned mask is formed on the $Al_2O_3$ layer, and all portions of the Al layer and the ITO layer which are left uncovered by the second patterned mask are removed, to thereby provide a resultant display panel structure including a matrix of pixel electrodes and gate electrodes/wiring structures.

20 Claims, 8 Drawing Sheets

PROCESS FOR MAKING A DISPLAY PANEL

BACKGROUND OF THE INVENTION

1. Field of the Invention

The present invention relates generally to a process for making a display panel of the type used in liquid crystal displays, and more particularly, to a process for making a gate electrode/wiring structure thereof.

2. Description of the Prior Art

FIG. 1 illustrates the structure of a conventional liquid crystal display panel. The reference numerals appearing in FIG. 1 designate the following elements: a substrate 1; a Cr (chromium) layer/gate electrode 2; an Al (aluminum) layer 3; a gate insulating layer 4; an amorphous silicon layer (a—Si) 5; a source electrode 6; a transparent pixel electrode 7; a gate wiring layer 8; and, a signal wiring layer 9 which serves as a drain electrode.

With continuing reference to FIG. the gate electrode 2 and the gate insulating layer 4 are formed of Cr and SiN (silicon nitride), respectively. The gate wiring layer 8 is a two-layered construction in which the Cr layer is formed on the substrate and the Al layer (which has a low specific resistance) is formed on the Cr layer. The gate insulating layer 4 and the a—Si layer 5 are formed by plasma chemical vapor deposition, and as a consequence, pinholes can occur therein due to the presence of contaminants such as dust. As a result, device yield is degraded due to short circuits occurring between the gate electrode/wiring layer and other (e.g., drain or source) electrode/wiring layers, as a consequence of pinholes occurring in the insulating layers disposed therebetween.

Various techniques for preventing these short circuits due to pinholes have been proposed heretofore. One technique, which is disclosed in U.S. Pat. No. 5,060,036, which is assigned to the assignee of the present invention, is to form on the gate electrode the double insulating layers and a laminated double-layer amorphous silicon (a—Si) structure with a silicon nitride (SiN) layer disposed therebetween. Another technique, which is disclosed in Japanese Un-examined Patent Publication No. 2-85826, is to employ a fabrication process as depicted in FIGS. 2A and 2B, as will now be described. More particularly, in accordance with this fabrication process, a gate electrode/wiring layer 12 comprised of a metal alloy, of which Al is a major constituent element, is formed on a substrate 11, and then patterned. A layer of pure aluminum (Al) 12' is then deposited on the gate electrode 12, and then anodized. The resultant anodized layer 13 serves as gate insulating film interposed between the gate electrode structure and the source and/or drain electrode structure. This technique purportedly eliminates hillocks, and thus, short circuits between adjacent electrodes at their cross-over points.

FIGS. 3A and 3B depict a plan view and a sectional view, respectively, of a display panel fabricated in accordance with the process illustrated in FIGS. 2A and 2B. The reference numerals appearing in FIGS. 3A and 3B designate the following elements: a substrate 11; an Al (or Al—Si or Al—Pd) layer 12; an $Al_2O_3$ layer 13; a silicon nitride (SiN) layer 14; an amorphous semiconductor layer 15; a silicon nitride (SiN) layer 16; and impurity-doped amorphous semiconductor layer 17; a Cr layer 18; an Al layer 19; a transparent electrode 20; a protective film 21; a gate wiring bus line 22; a gate wiring structure 23, 24; a signal line (drain electrode) 25; a thin film transistor A; and, an anodized region B of the signal lines 25.

In the conventional active matrix liquid crystal display panel depicted in FIGS. 3A and 3B, current is supplied through the gate electrode/wiring structure 12 when the Al layer 12' is anodized, in order to form an insulating layer 13 between the adjacent electrodes/wiring structures 12, as can be seen in FIGS. 2A–2D and 3A and 3B. However, unanodized Al strips 27 often remain between the adjacent electrodes/wiring structures 12, as shown in FIGS. 2C and 2D. Consequently, an $Al_2O_3$ film with inferior transparency is obtained due to the opacity (i.e. zero light transmittance) of the residual unanodized aluminum strips 27. Moreover, te presence of these residual unanodized aluminum strips 27 disadvantageously affects the desired flattening of the electrodes/wiring structures, i.e., renders the upper surface of the composite resultant structure (12, 13) uneven/unlevel, which increases the complexity of subsequent manufacturing steps, resulting in, among other things, pinholes and unreliable step coverage. Ultimately, due to the above-mentioned problems, there is still an unacceptable likelihood that short circuits will occur between adjacent electrodes/wiring structures and thereby diminish device yield.

It is therefore an object of the present invention to eliminate the above-described problems, disadvantages, and shortcomings of the presently available display panels and processes for making the same.

SUMMARY OF THE INVENTION

The present invention achieves these and other objects by a method for fabricating a display panel including the steps of forming a transparent, conductive layer on an insulating substrate; forming a metal layer on the transparent, conductive layer; anodizing the metal layer to form an oxidized insulating layer of predetermined thickness on the metal layer; forming a patterned mask made of material which is not anodized on the oxidized insulating layer to facilitate the formation of a corresponding pattern of gate electrodes/wiring structures; and, anodizing the metal layer a second time except for portions thereof covered by the patterned mask, which portions remain intact to serve as the gate electrodes/wiring structures of the display panel. In one embodiment of the present invention, the transparent, conductive layer is patterned before the first anodization step is performed, and in another embodiment, the transparent, conductive layer is patterned after the second anodization steps is performed, to thereby provide a matrix of pixel electrodes.

The present invention, in another of its aspects, also encompasses a method for fabricating a display panel including the steps of forming a transparent, electrically conductive layer on a major surface of an insulating substrate; forming an anodizable metal layer on the transparent, electrically conductive layer; forming a patterned pixel separating layer on the metal layer to provide coverage only over selected portions of the metal layer; performing a first anodization step, with the patterned pixel separating layer serving as a mask, so that the selected portions of the metal layer are not anodized, thereby resulting in the formation of a patterned oxide film on the metal layer which is a negative image of the patterned pixel separating layer; forming a first patterned mask on the patterned oxide film and the selected portions of the metal layer to provide coverage over all of the selected portions of the metal layer but only over selected regions of the patterned oxide film corresponding to the desired location of gate electrodes/wiring structures; performing a second anodization step to thereby form a transparent, oxidized insulating layer over areas uncovered by the first patterned mask; forming a second pattered mask on the transparent, oxidized insulating layer; and, removing all portions of the metal layer and the transparent, electrically conductive layer which are left uncovered by the second pattered mask, to thereby provide a resultant display panel structure including a matrix of pixel electrodes and gate electrodes/wiring structures.

BRIEF DESCRIPTION OF THE DRAWINGS

These and various other features and advantages of the present invention may be more readily and fully understood with reference to the following detailed description taken in conjunction with the accompanying drawings, wherein like reference numerals designate like structural elements, and in which.

DETAILED DESCRIPTION OF PREFERRED EMBODIMENTS

With reference now to FIGS. 4A to 4D, anodization steps employed in practicing the method for fabricating a display panel in accordance with a first preferred embodiment of the present invention will now be described.

Figure 1A:
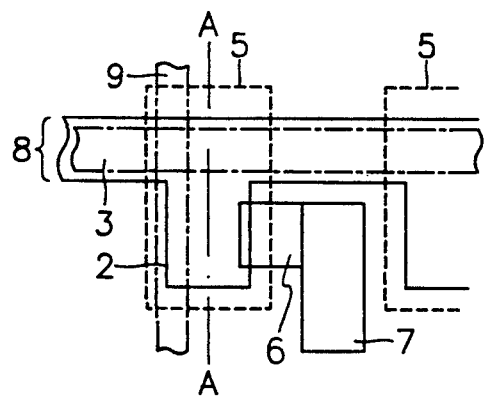
FIG. 1A is a plan view of a prior art display panel.
Figure 1B:
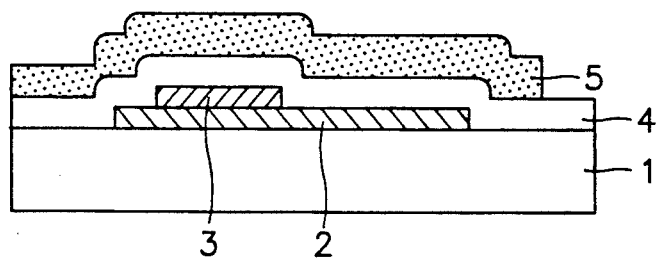
FIG. 1B is a sectional view of the prior art display panel illustrated in FIG. 1A, taken along lines A—A'.
Figure 3A:
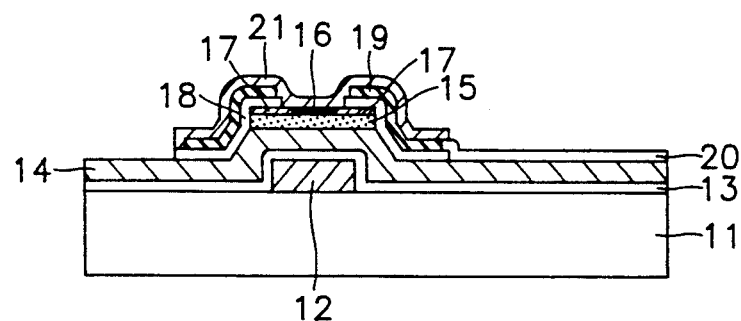
FIGS. 3A and 3B are sectional and plan views, respectively, of a completed display panel manufactured in accordance with the process depicted in FIGS. 2A to 2D.
Figure 3B:
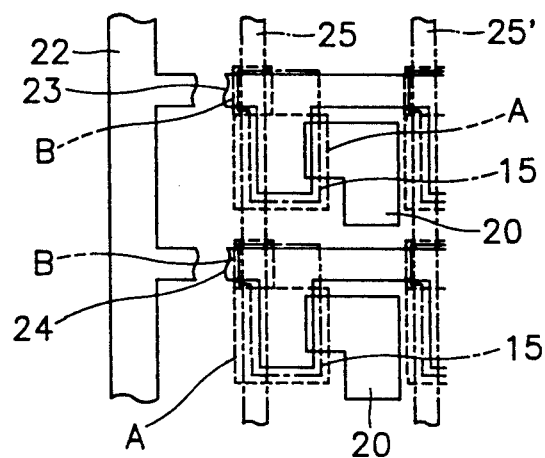
Figure 2A:
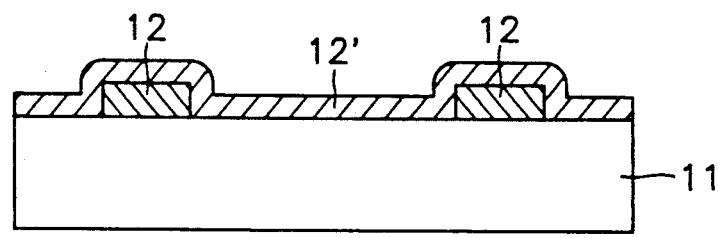
FIGS. 2A to 2C are schematic sectional views of another prior art display panel, illustrating successive steps in the process for fabricating the same.
Figure 2B:
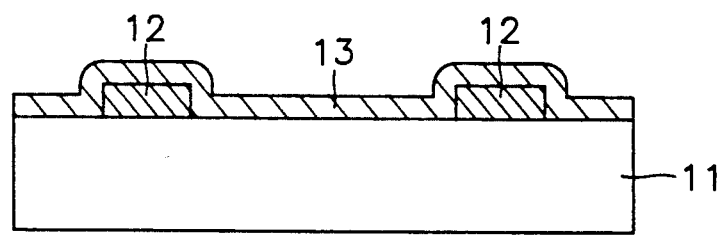
Figure 2C:
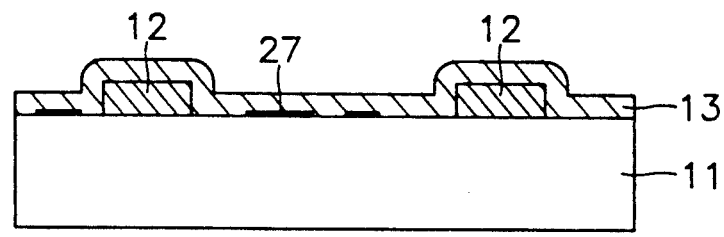
Figure 2D:
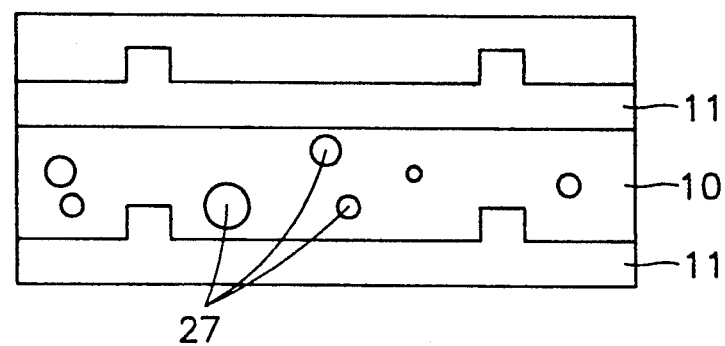
FIG. 2D is a plan view of the display panel depicted in FIG. 2A.
Figure 4A:
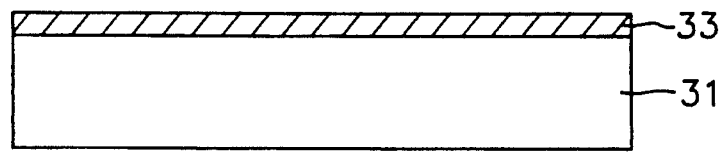
FIGS. 4A to 4D are schematic sectional views of a display panel of the present invention, illustrating successive anodization steps in the process for fabricating the same.

More particularly, as is depicted in FIG. 4A, an aluminum (Al) layer 33 is deposited on an insulating substrate 31, which can conveniently be made of glass or any other suitable electrically insulating material. The Al layer 33 may be deposited by any well-known deposition technique, e.g., sputtering, to a thickness of preferably more than 2500 angstroms, although this is not a limiting feature of this embodiment of the present invention, in its broadest sense.

Figure 4B:
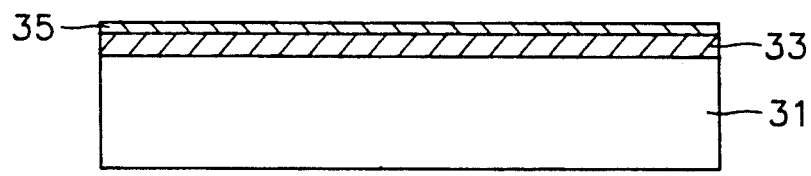

Subsequently, as is depicted in FIG. 4B, a thin $Al_2O_3$ insulating layer 35 is formed on the Al layer 33 by a first anodization step carried out, for example, with an electrolytic voltage of approximately 30 V, using an electrolyte consisting of, for example, a 3% tartaric acid solution diluted with ethylene glycol incorporated with liquid ammonia having ph $7.0\pm0.5$.

Figure 4C:
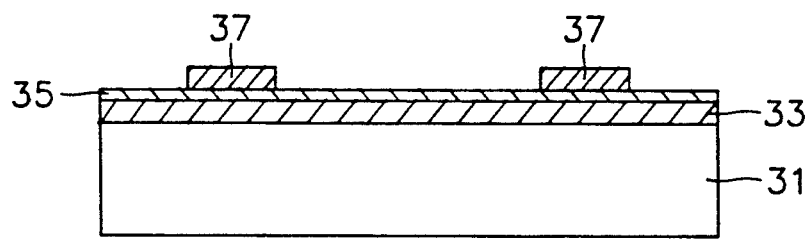

Next, as is depicted in FIG. 4C, a layer of photoresist 37 is patterned to provide coverage only over the regions of the insulating layer 35 where the gate electrode/wiring structure is to be subsequently formed, as will be described hereinafter. In this case, chromium which is not anodized may be used instead of photoresist.

Figure 4D:
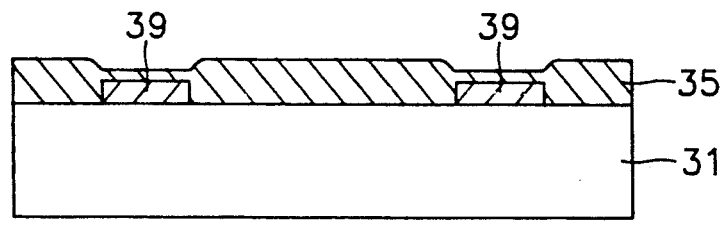

Thereafter, a second anodization step is performed with a higher electrolytic voltage than employed in conjunction with the first anodization step, e.g., with an electrolytic voltage of 200 V, and then the patterned photoresist layer 37 is removed, thereby providing the resultant structure shown in FIG. 4D, with an $Al_2O_3$ insulating layer 35 having a first portion of relatively greater thickness, e.g., approximately 3000 angstroms, covering the regions between adjacent gate electrodes/wiring structures 39, and having a second portion of relatively lesser thickness, e.g., approximately 500 angstroms, covering the gate electrodes/wiring structures 39.

It should be understood that the metal used in the above-described anodization process to form the gate electrodes/wiring structures 39 may be either pure aluminum (Al), or, alternatively, may be any suitable aluminum alloy, e.g., Al—Si or Al—Pd, in which Al is a major constituent element.

With reference now to FIGS. 5A to 5E, te various manufacturing steps employed in practicing the method for fabricating a display panel in accordance with the first preferred embodiment of the present invention will now be described. As will be appreciated, this method incorporates the anodization process described above in connection with FIGS. 4A to 4D. The display panel manufactured in accordance with the method depicted in FIGS. 5A to 5E is illustrated in plan view in FIG. 6.

Figure 5A:
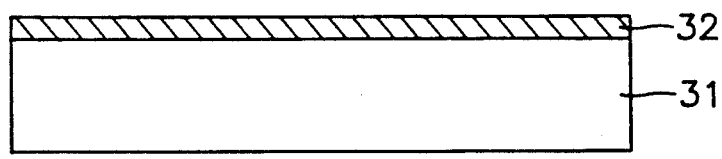
FIGS. 5A to 5E are schematic sectional views of a display panel of the present invention, illustrating successive steps in the process for fabricating the same in accordance with a first embodiment of the preset invention.

More particularly, as is depicted in FIG. 5A, a transparent conductive film or layer 32, made of any suitable transparent, electrically conductive material, e.g., indium tin oxide (InSnO or ITO), is deposited on the insulating substrate 31. The ITO layer 32 may be deposited by any well-known deposition technique, e.g., sputtering, to a thickness of preferably about 300 angstroms, although this thickness is not a limiting aspect of this embodiment of the present invention, in its broadest sense.

Figure 5B:
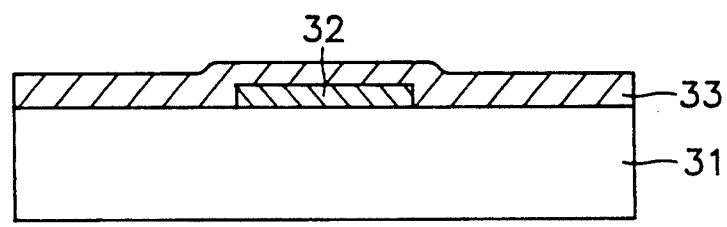
Figure 5C:
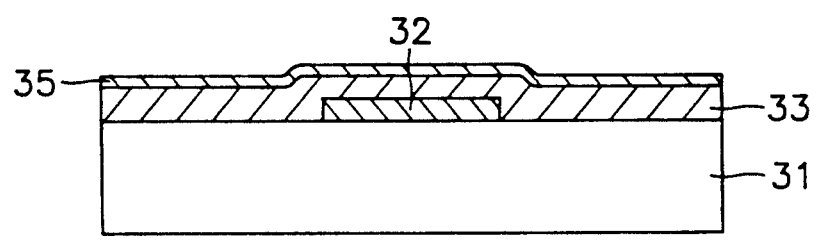
Figure 6:
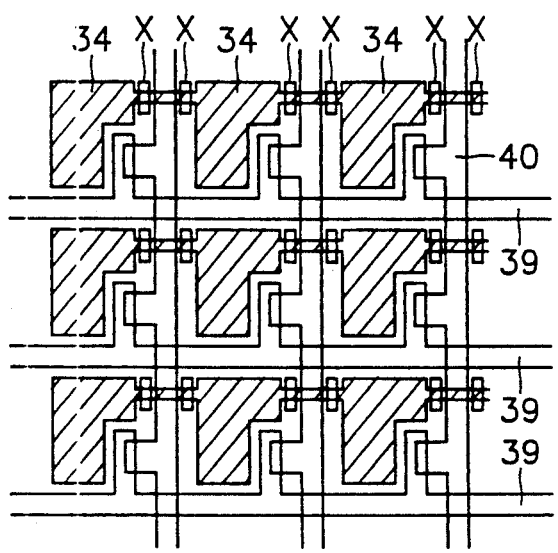
FIG. 6 is a plan view of a display panel manufactured in accordance with the method of the present invention depicted in FIGS. 5A to 5E.

Subsequently, as is depicted in FIG. 5B, the ITO layer 32 is suitably patterned, e.g., by a standard photolithographic process, to provide a matrix of pixel electrodes 34, as can be seen in FIG. 6. Thereafter, as can be seen in FIG. 5C, an Al layer 33 having a thickness of preferably more than 2500 angstroms, is deposited, e.g., by sputtering, on the entire surface of the resultant structure (31, 32, 33) shown in FIG. 5B. Next, the first anodization step depicted in FIG. 4B is performed to form the $Al_2O_3$ insulating layer 35 having a thickness of preferably about 500 angstroms on the Al layer 33, e.g., by employing an electrolytic voltage of approximately 30 V. The ITO layer 32 serves as the base electrode during the anodization process.

Figure 5D:
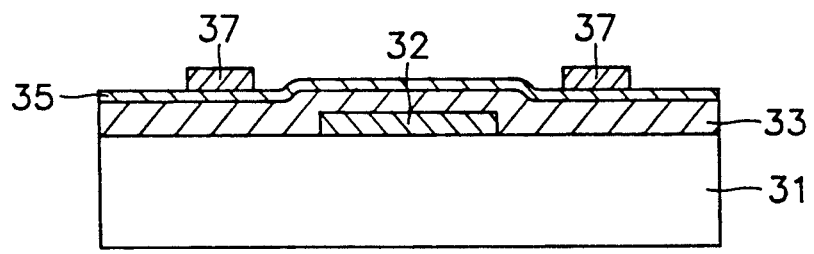
Figure 5E:
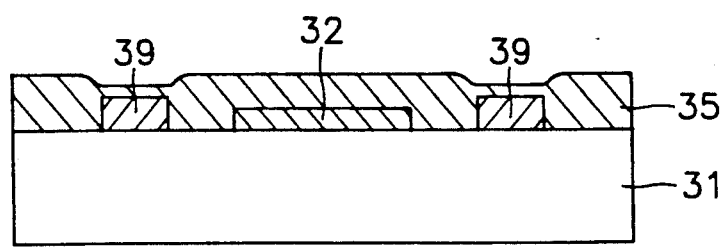

FIGS. 5D and 5E illustrate the manufacturing steps preferably utilized to fabricate the gate electrodes/wiring structures 39. More particularly, an appropriately patterned photoresist mask 37 is deposited to provide coverage only over the regions of the insulating layer 35 corresponding to the ultimate location of the gate electrodes/wiring structures 39.

In this case, chromium may be used as the patterned mask instead of photoresist. Thereafter, the second anodization step depicted in FIG. 4D is performed with a higher electrolytic voltage than employed in conjunction with the first anodization step, e.g., with an electrolytic voltage of 200 V, and the photoresist 37 is removed, to thereby form the resultant structure shown in FIG. 5E, with an $Al_2O_3$ insulating layer 35 having a first portion of relatively greater thickness, e.g., approximately 3000 angstroms, covering the regions between adjacent gate electrodes/wiring structures 39, and having a second portion of relatively lesser thickness, e.g., approximately 500 angstroms, covering the gate electrodes/wiring structures 39.

It should be appreciated that during performance of the second anodization step, the Al regions underneath the patterned photoresist material 37 are not oxidized and thus remain intact to provide the gate electrodes/wiring structures 39. Also, it should be appreciated that since the second anodization step for forming the $Al_2O_3$ layer 35 is carried out by utilizing the ITO layer 32 as the base electrode, the anodization rate thus obtained is higher than that of the conventional prior art method of forming the gate electrodes/wiring structures first and then carrying out the anodization step by utilizing the gate electrodes/wiring structures as the base electrode.

Moreover, in accordance with the method of the first preferred embodiment of the present invention described above, the anodized $Al_2O_3$ layer 35 is completely anodized, thereby significantly increasing the transparency thereof relative to the transparency of the anodized $Al_2O_3$ layer 13 produced by the prior art process depicted in FIGS. 2A to 2D. More particularly, the transparency (i.e. light transmittance) of the anodized $Al_2O_3$ layer 35 fabricated in accordance with the method of the present invention is more than 80%, due to the absence of any opaque, residual unanodized aluminum within the region of the layer 35 between adjacent gate electrodes/wiring structures 39, such as the opaque, residual unanodized Al strips 27 which are present in the anodized $Al_2O_3$ layer 13 produced by the prior art process depicted in FIGS. 2A & 2D.

Furthermore, the anodized $Al_2O_3$ layer 35 is significantly flattened relative to the anodized $Al_2O_3$ layer 13 produced by the prior art process depicted in FIGS. 2A to 2D. Otherwise stated, the height difference (i.e. "step height") between the first portion of the insulating layer 35 disposed between adjacent gate electrodes/wiring structures 39 and the second portion of the insulating layer 35 disposed above the gate electrodes/wiring structures 39 is much less than the corresponding step height between the first portion and the second portion of the prior art insulating layer 13 depicted in FIGS. 2A to 2D, as is clearly evidenced by the visual contrast of the resultant structure depicted in FIG. 2C vis-a-vis the resultant structure depicted in FIG. 5E. In fact, the entire upper surface of the insulating layer 35 of the display panel of the present invention is substantially flat, i.e., level/flush.

This reduced step height of the insulating layer 35 produced in accordance with the method of the present invention enables improved step coverage to be realized during subsequent manufacturing steps in which the source and drain electrodes (not shown) are formed to complete the thin film transistor (TFT) active matrix liquid crystal display panel, not shown, in a manner which is already well-known in the art to which this invention pertains. Ultimately, this improved step coverage reduces the likelihood and incidence of discontinuities in the insulating layer between the gate electrodes/wiring structures and the drain and/or source electrodes/wiring structures, thus minimizing the occurrence of short circuits therebetween. Consequently, device manufacturing yield is significantly enhanced with the present invention.

Referring now to FIG. 6, there can be seen a plan view of the intermediate display panel produced by the manufacturing method illustrated in FIGS. 5A to 5E, as described above. As can be easily seen in FIG. 6, the portions X of the patterned ITO layer 32 interconnecting the ITO pixel electrodes 34 are removed, e.g., by etching, to thereby provide a finished matrix of electrically separated pixel electrodes 34. Signal lines 40 are provided to carry signals for application to the gate electrodes/wiring structures 39.

As previously mentioned, subsequent to the process steps described in connection with FIGS. 5A to 5E, further process steps must be performed on the intermediate display panel shown in FIG. 6 in order to produce a completed display panel. In brief, these subsequent manufacturing steps include depositing a second gate insulating layer, generally made of $SiN_x$ or $SiO_2$, forming an amorphous semiconductor layer, e.g., an a—Si layer, and an n+ a—Si ohmic layer, and forming a pattern of source and drain electrodes. Since these subsequent manufacturing steps are already well-known to those skilled in the art to which this invention pertains, they will not be described in detail herein.

Figure 7A:
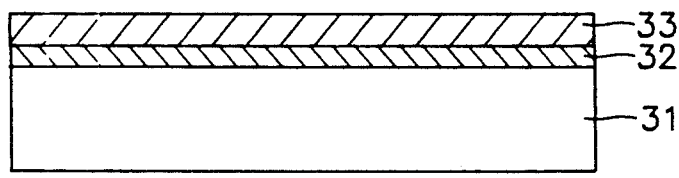
FIGS. 7A to 7D are schematic sectional views of a displayed panel of the present invention, illustrating successive steps in the process for fabricating the same in accordance with a second embodiment of the present invention.

With reference now to FIGS. 7A to 7D, the steps employed in practicing the method for fabricating a display panel in accordance with a second preferred embodiment of the present invention will now be described. More particularly, as is depicted in FIG. 7A, the ITO layer 32 is deposted on the glass substrate 31, e.g., by sputtering, and the Al layer 33 is deposited directly on the ITO layer 32. The ITO layer 32 has a thickness of preferably more than 500 angstroms, and the Al layer 33 has a thickness of preferably more than 2000 angstroms, although these thicknesses are not limiting to the present invention, in its broadest sense. As can be readily appreciated by comparing FIG. 7A with FIG. 5B, the method of the second preferred embodiment of the present invention differs from the first preferred embodiment of the present invention in that in the second embodiment the Al layer 33 is deposited directly on the ITO layer 32 before the ITO layer 32 is patterned, whereas in the first embodiment, the Al layer 33 is deposited on the ITO layer 32 after the ITO layer 32 is patterned.

Figure 7B:
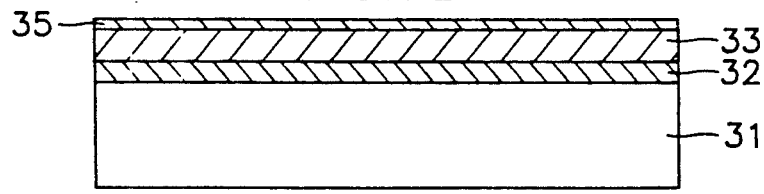

Subsequently, as is depicted in FIG. 7B, the first anodization step depicted in FIG. 4B is performed to form the thin (e.g., about 500 angstroms) $Al_2O_3$ insulating layer 35 on the Al layer 33. Thus, in this embodiment, the entire ITO layer 32 serves as a base electrode during the anodization process. Accordingly, the anodization rate in this embodiment is higher than that of the first embodiment, since the unpatterned ITO layer of the second embodiment has a much broader surface area than the patterned ITO layer of the first embodiment.

Figure 7C:
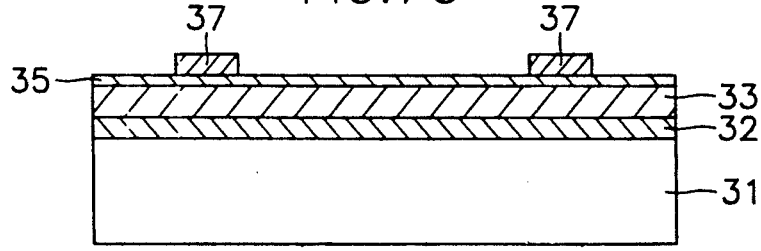
Figure 7D:
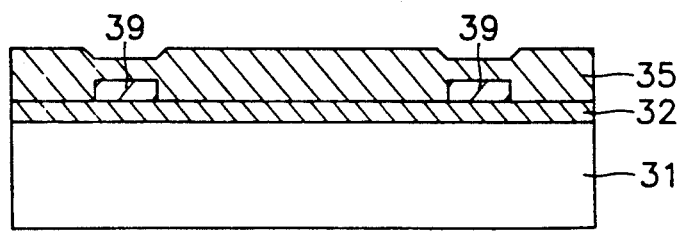

FIGS. 7C and 7D illustrates the manufacturing steps preferably utilized to fabricate the gate electrodes/wiring structures 39. More particularly, an appropriately patterned photoresist mask 37 is deposited to provide coverage only over the regions of the insulating layer 35 corresponding to the ultimate location of the gate electrodes/wiring structures 39. Thereafter, the second anodization step depicted in FIG. 4D is performed with a higher electrolytic voltage than employed in conjunction with the first anodization step, e.g., with an electrolytic voltage of 200 V, and the photoresist 37 is removed, to thereby form the resultant structure shown in FIG. 7D, with an $Al_2O_3$ insulating layer 35 having a first portion of relatively greater thickness covering the regions between adjacent gate electrodes/wiring structures 39, and having a second portion of relatively lesser thickness covering the gate electrodes/wiring structures 39. Again, it should be appreciated that during the execution of the second anodization step, the regions of the Al layer 33 located underneath the patterned photoresist material 37 are not anodized/oxidized, and thus, remain intact to serve as the gate electrodes/wiring 39.

After the above steps are carried out, the ITO layer 32 is patterned to provide a matrix of electrically separated pixel electrodes 34, such as is depicted in FIG. 6. Of course, as discussed previously in connection with the first embodiment of the present invention, subsequent process steps must be performed in order to produce the completed display panel, in a manner already well-known to those skilled in the art to which this invention pertains.

Figure 8A:
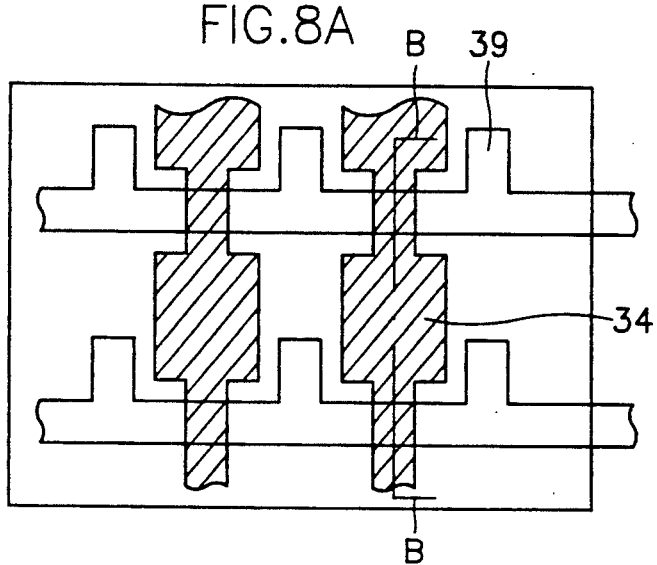
FIG. 8A is a plan view of a display panel constructed in accordance with a third embodiment of the preset invention.
Figure 8B:
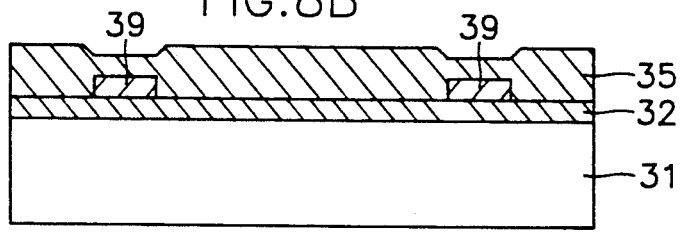
FIG. 8B is a sectional view taken along lines B—B of FIG. 8A.

With reference now to FIGS. 8A and 8B, a third embodiment of the present invention will now be described. More particularly, FIG. 8A is a plan view which depicts an ITO layer 32 having a different pattern from that shown in FIG. 6 in connection with the first and second embodiments of the present invention. As can be readily seen, the cross-sectional profile of the intermediate display panel of this embodiment of the present invention depicted in FIG. 8B is identical to the cross-sectional profile of the second embodiment of the present invention depicted in FIG. 7D. Thus, the primary difference between these two embodiments resides in the different patterning of the ITO layer 32.

Figure 9A:
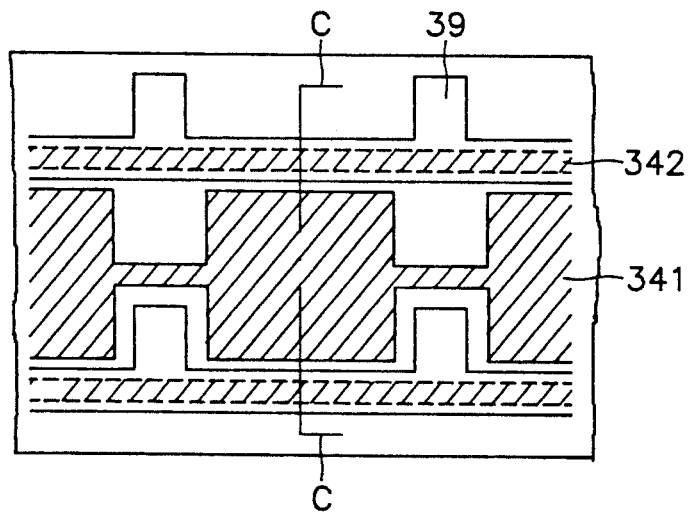
FIGS. 9A and 9B show respectively a plan view of a modified example and a sectional view taken along lines C—C of FIG. 9A.
Figure 9B:
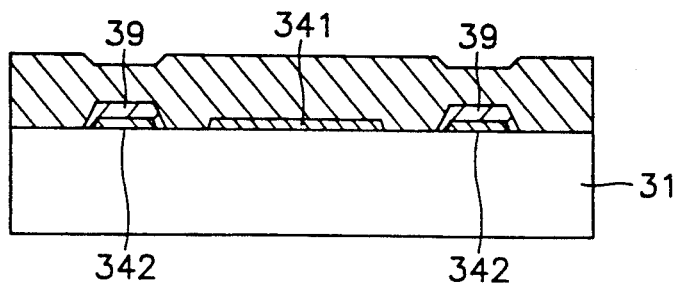

With reference now to FIGS. 9A and 9B, a fourth embodiment of the present invention will now be described. More particularly, FIG. 9A is a plan view which depicts an ITO layer 32 having a different pattern from that depicted in FIGS. 6 and 8A in connection with the first, second, and third embodiments of the present invention. Thus, the configuration of the matrix of pixel electrodes 34 created by the patterning of the ITO layer 32 in this embodiment of the present invention is different from the configuration of the matrix of pixel electrodes 34 created by the patterning of the ITO layer 32 in the first, second, and third embodiments of the present invention. It should be noted that, in this embodiment, the ITO layer 32 is patterned to have separate portions designated 341 and 342, with the portions 342 being disposed underneath the gate electrodes/wiring structures 39, and the portions 341 being disposed therebetween.

With reference now to FIGS. 10A to 10F, the steps employed in practicing the method for fabricating a display panel in accordance with a fifth embodiment of the present invention will now be described. More particularly, with specific reference to FIG. 10A, an ITO layer 32 and Al layer 33 are formed in the same manner as described previously in connection with the second through fourth embodiments of the present invention. However, in this embodiment, a patterned ITO pixel separating layer 36 is formed on the Al layer 33 in order to facilitate the formation of electrically separate pixel electrodes 34 in a manner which will be described hereinafter.

Figure 10A:
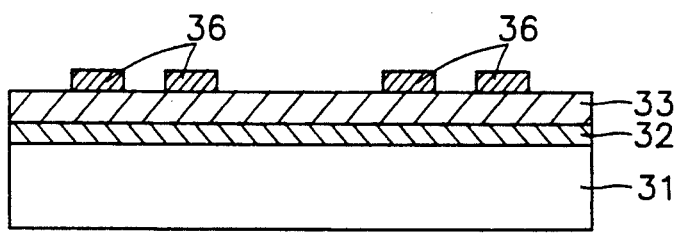
FIGS. 10A to 10F are schematic sectional views illustrating successive manufacturing steps of the method of the present invention.
Figure 10B:
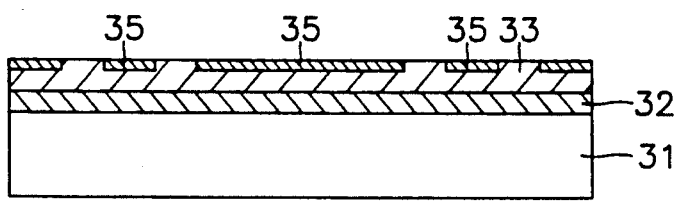

Subsequently, as is depicted in FIG. 10B, a first anodization step is performed with the patterned ITO pixel separating layer 36 serving as a mask, so that only the portions of the Al layer 33 which are not covered thereby are anodized. Thus, a patterned oxide film 35 which is a negative image of the patterned ITO pixel separating layer 36 is formed on the Al layer 33. The patterned oxide film 35 is preferably relatively thin, e.g., approximately 100 angstroms, compared to the thickness of the Al layer 33, e.g., 2500 angstroms.

Figure 10C:
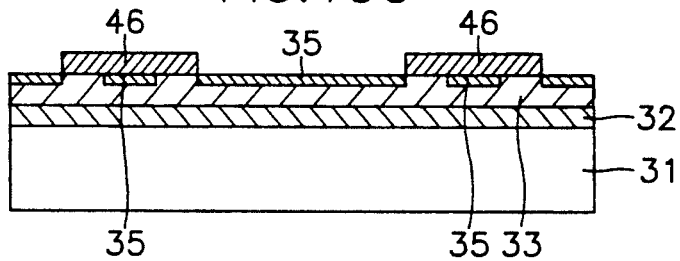

Next, the patterned ITO pixel separating layer 36 is removed and, as is depicted in FIG. 10C, a patterned photoresist layer 46 is then formed on the resultant structure of FIG. 10B, to provide coverage only over those regions of the Al layer 33 and the patterned oxide film 35 corresponding to the ultimate location of the gate electrodes/wiring structures 39, as well as the former location of the patterned ITO pixel separating layer 36.

Figure 10D:
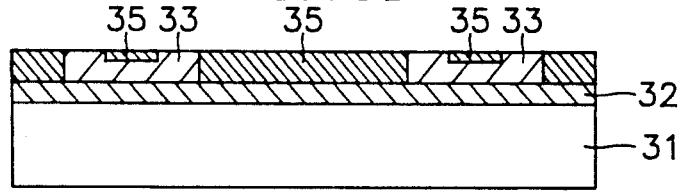

Thereafter, a second anodization step is performed, and the photoresist material 46 removed, to thereby form the resultant structure shown in FIG. 10D, including a transparent $Al_2O_3$ layer 35 having first portions of relatively greater thickness, e.g., 3000 angstroms, provided on the surface of the ITO layer 32 on the regions thereof which are not covered by the patterned photoresist layer 46, and second portions of relatively lesser thickness, e.g., 100 angstroms, corresponding to the portions of the thin oxide film 35 shown in FIG. 10C located underneath the patterned photoresist layer 46, which are left undisturbed by the second anodization step.

Figure 10E:
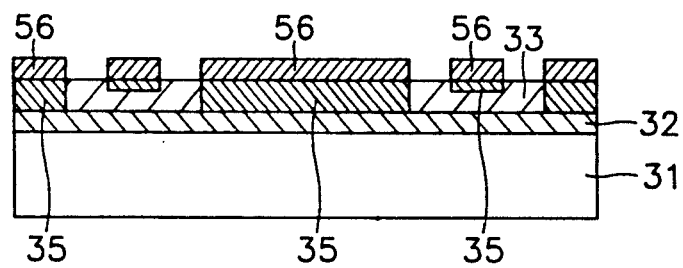
Figure 10F:
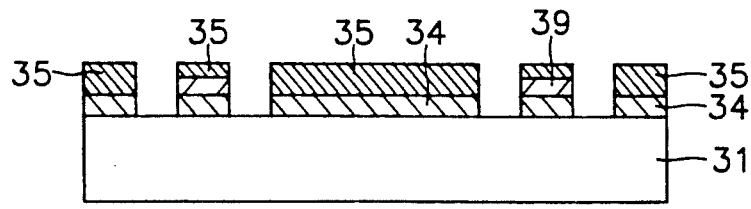
Figure 11:
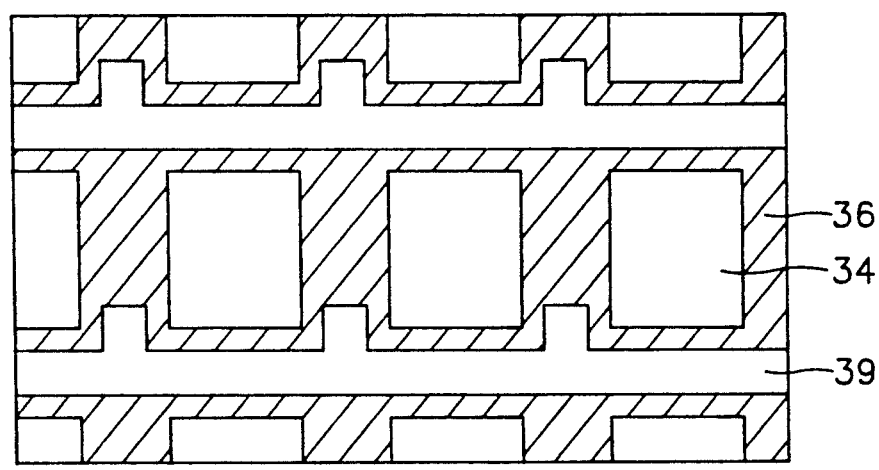
FIG. 11 is a plan view illustrating a pattern for separating ITO pixels.

Next, as is depicted in FIG. 10E, another patterned photoresist mask 56 is formed on the resultant structure shown in FIG. 10D to provide coverage only over both the first and second portions of the insulating layer 35. Thenceforth, the portions of the Al layer 33 and the ITO layer 32 which are uncovered by the patterned photoresist mask 56 are etched away, and the photoresist material 56 then removed, to thereby provide the resultant structure shown in the sectional view of FIG. 10F and the plan view of FIG. 11, including a matrix of electrically separated pixel electrodes 34 and gate electrodes/wiring structures 39.

Although various preferred embodiments of the present invention have been described in detail hereinabove, it should be clearly understood that many variations and/or modifications of the basic inventive concepts herein taught which may appear to those skilled in the art to which this invention pertains will still fall within the spirit and scope of the present invention, which should be interpreted on the basis of the following claims.

What is claimed is:

1. A method for fabricating a display panel, comprising the steps of:
   forming a transparent, electrically conductive layer on a major surface of an electrically insulating substrate;
   patterning said electrically conductive layer in such a manner as to form a matrix of pixel electrodes;
   forming an anodizable metal layer on said major surface of said insulating substrate and said matrix of pixel electrodes;
   performing a first anodization step to thereby form an oxidized insulating layer on said anodizable metal layer;
   forming a patterned mask on said oxidized insulating layer to provide coverage only over regions of said oxidized insulating layer corresponding to the desired location of gate electrodes/wiring structures; and,
   performing a second anodization step to anodize all portions of said metal layer except portions thereof disposed beneath said patterned mask, which portions remain intact to serve as said gate electrodes/wiring structures of the display panel.

2. The method as set forth in claim 1, wherein said metal layer is made of a material selected from the group comprised of elemental aluminum and aluminum alloys whose principal constituent element is aluminum.

3. The method as set forth in claim 1, wherein said first anodization step is performed using a first electrolytic voltage and said second anodization step is performed using a second electrolytic voltage, said second electrolytic voltage being higher than said first electrolytic voltage.

4. The method as set forth in claim 2, wherein said transparent, electrically conductive layer is comprised of indium tin oxide.

5. The method as set forth in claim i, wherein said transparent, electrically conductive layer is used as a base electrode in at least one of said first and second anodization steps.

6. The method as set forth in claim 1, wherein, after said second anodization step is completed, said oxidized insulating layer has a first portion of a first predetermined thickness disposed between adjacent ones of said gate electrodes/wiring structures, and a second portion of a second predetermined thickness disposed above said gate electrodes/wiring structures, said first predetermined thickness being greater than said second predetermined thickness.

7. The method as set forth in claim 6, wherein said metal layer has a thickness of greater than approximately 2500 angstroms.

8. The method as set forth in claim 1, further comprising the step of selectively removing interconnecting portions of said pixel electrodes to thereby electrically separate said pixel electrodes.

9. The method as set forth in claim 6, wherein said patterned mask is made of a material selected from the group comprised of photoresist and chromium.

10. The method as set forth in claim 1, wherein said metal layer is patterned to have separate first and second portions, with said first portions being disposed beneath said gate electrodes/wiring structures, and said second portions being disposed therebetween.

11. The method as set forth in claim 2, wherein said oxidized insulating layer is comprised of $Al_2O_3$.

12. A method for fabricating a display panel, comprising the steps of:
   forming a transparent, electrically conductive layer on a major surface of an electrically insulating substrate;
   forming an anodizable metal layer on said transparent, electrically conductive layer;
   performing a first anodization step to thereby form an oxidized insulating layer on said anodizable metal layer;
   forming a patterned mask on said oxidized insulating layer to provide coverage only over selected regions of said oxidized insulating layer; and
   performing a second anodization step to anodize all portions of said metal layer except portions thereof disposed beneath said selected regions, which portions remain intact to serve as gate electrodes/wiring structures.

13. The method as set forth in claim 12, further comprising the step of patterning said transparent, electrically conductive layer in such a manner as to form a matrix of pixel electrodes.

14. The method as set forth in claim 12, wherein said transparent, electrically conductive layer serves as a base electrode during at least said first anodization step.

15. A method for fabricating a display panel, comprising the steps of:
   forming a transparent, electrically conductive layer on a major surface of an electrically insulating substrate;
   forming an anodizable metal layer on said transparent, electrically conductive layer;
   forming a patterned pixel separating layer on said metal layer to provide coverage only over selected portions of said metal layer;
   performing a first anodization step, with said patterned pixel separating layer serving as a mask, so that said selected portions of said metal layer are not anodized, thereby resulting in the formation of a patterned oxide film on said metal layer which is a negative image of said patterned pixel separating layer;
   forming a first patterned mask on said patterned oxide film and said selected portions of said metal layer to provide coverage over all of said selected portions of said metal layer but only over selected regions of said patterned oxide film corresponding to the desired location of gate electrodes/wiring structures;
   performing a second anodization step to thereby form a transparent, oxidized insulating layer having first portions of relatively greater thickness in areas uncovered by said first patterned mask and having second portions of relatively lesser thickness corresponding to said selected regions of said patterned oxide film covered by said first patterned mask;
   forming a second patterned mask on both said first portions and said second portions of said transparent, oxidized insulating layer; and,
   removing all portions of said metal layer and said transparent, electrically conductive layer which are left uncovered by said second patterned mask, to thereby provide a resultant display panel structure including a matrix of pixel electrodes and gate electrodes/wiring structures.

16. The method as set forth in claim 15, wherein said patterned oxide film has a thickness which is less than the thickness of said anodizable metal layer.

17. The method as set forth in claim 15, wherein said patterned pixel separating layer is comprised of indium tin oxide.

18. The method as set forth in claim 15, wherein said first and said second patterned masks are comprised of a photoresist material.

19. The method as set forth in claim 15, wherein said transparent, oxidized insulating layer is substantially flat.

20. The method as set forth in claim 19, wherein said transparent, oxidized insulating layer exhibits a light transmittance of at least approximately 80%.

* * * * *